(12) United States Patent
Ergun et al.

(10) Patent No.: US 12,368,441 B2
(45) Date of Patent: Jul. 22, 2025

(54) POWER SUPPLY CALIBRATION FOR VOLTAGE CONTROLLED OSCILLATORS

(71) Applicant: QUALCOMM Incorporated, San Diego, CA (US)

(72) Inventors: Burcin Serter Ergun, Poway, CA (US); Zhiqin Chen, San Diego, CA (US); Julian Puscar, Holly Springs, NC (US); Brett Patrick Delaney, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 24 days.

(21) Appl. No.: 18/512,617

(22) Filed: Nov. 17, 2023

(65) Prior Publication Data

US 2025/0167773 A1 May 22, 2025

(51) Int. Cl.
| | |
|---|---|
| H03K 3/011 | (2006.01) |
| G05F 1/575 | (2006.01) |
| H03K 3/03 | (2006.01) |
| H03L 1/00 | (2006.01) |
| H03L 5/00 | (2006.01) |

(52) U.S. Cl.
CPC ............... *H03L 1/00* (2013.01); *G05F 1/575* (2013.01); *H03K 3/011* (2013.01); *H03K 3/0315* (2013.01); *H03L 5/00* (2013.01)

(58) Field of Classification Search
None
See application file for complete search history.

(56) References Cited

U.S. PATENT DOCUMENTS

| | | | |
|---|---|---|---|
| 6,496,056 B1 * | 12/2002 | Shoji | H03L 1/00 327/543 |
| 7,042,299 B2 * | 5/2006 | Tachibana | H03B 5/364 331/158 |
| 7,701,301 B2 * | 4/2010 | Lakshmikumar | H03K 3/0315 331/186 |

(Continued)

FOREIGN PATENT DOCUMENTS

EP   1037388 A2   9/2000

OTHER PUBLICATIONS

International Search Report and Written Opinion—PCT/US2024/053900—ISA/EPO—Feb. 11, 2025.

(Continued)

*Primary Examiner* — Thomas J. Hiltunen
(74) *Attorney, Agent, or Firm* — Loza & Loza, LLP

(57) ABSTRACT

A clock generation circuit has a voltage-controlled oscillator that includes a first transistor pair coupled in series between a power rail and ground, a replica transistor pair coupled in series between a reference node and ground, a current source having an output coupled to the reference node. The current source is coupled to a control signal that determines amplitude of current flowing through the replica transistor pair. A voltage regulator has an input coupled to the reference node and an output coupled to the power rail. The voltage regulator is configured to maintain the power rail at a voltage level defined by the voltage level of the reference node. Each transistor in the replica transistor pair is collocated on an integrated circuit with and has a same type as a corresponding transistor in the first transistor pair.

27 Claims, 8 Drawing Sheets

(56) References Cited

U.S. PATENT DOCUMENTS

| | | | | |
|---|---|---|---|---|
| 8,102,217 | B2* | 1/2012 | Aoki | H03L 3/00 |
| | | | | 331/172 |
| 8,143,963 | B2* | 3/2012 | Lin | H03L 1/022 |
| | | | | 331/158 |
| 8,362,848 | B2* | 1/2013 | Raghunathan | H03L 7/24 |
| | | | | 327/158 |
| 9,300,247 | B2* | 3/2016 | Roine | H03B 5/24 |
| 10,454,418 | B1* | 10/2019 | Jain | G05F 1/575 |
| 10,659,013 | B2* | 5/2020 | Wang | H03K 3/0315 |
| 11,467,613 | B2* | 10/2022 | Zukowski | G05F 1/575 |
| 2012/0206209 | A1 | 8/2012 | Kaufman et al. | |
| 2017/0288651 | A1 | 10/2017 | Khare | |

OTHER PUBLICATIONS

Tanguay L-F., et al., "A 640 µW Frequency Synthesizer Dedicated to Implantable Medical Microsystems in 90-nm CMOS", NEWCAS Conference (NEWCAS), 2010 8th IEEE International, IEEE, Piscataway, NJ, USA, Jun. 20, 2010, pp. 369-372, XP031777147, paragraph [0001]—paragraph [00IV], figures 1-7.

* cited by examiner

POWER SUPPLY CALIBRATION FOR VOLTAGE CONTROLLED OSCILLATORS

TECHNICAL FIELD

The present disclosure relates generally to a clock generation circuits and, more particularly, to clock generation circuits that can automatically compensate for process, voltage or temperature variances.

BACKGROUND

Electronic device technologies have seen explosive growth over the past several years. For example, growth of cellular and wireless communication technologies has been fueled by better communications, hardware, larger networks, and more reliable protocols. Wireless service providers are now able to offer their customers an ever-expanding array of features and services, and provide users with unprecedented levels of access to information, resources, and communications. To keep pace with these service enhancements, mobile electronic devices (e.g., cellular phones, tablets, laptops, etc.) have become more powerful and complex than ever. Wireless devices may include a high-speed bus interface for communication of signals between hardware components.

High-speed serial buses offer advantages over parallel communication links when, for example, there is demand for reduced power consumption and smaller footprints in integrated circuit (IC) devices. In a serial interface, data is converted from parallel words to a serial stream of bits using a serializer and is converted back to parallel words at the receiver using a deserializer. For example, the high-speed bus interface may be implemented using a Peripheral Component Interconnect Express (PCIe) bus, Universal Serial Bus (USB) or Serial Advanced Technology Attachment (SATA), among others.

IC devices may include a serializer/deserializer (SERDES) to transmit and receive through a communication link. In high-speed applications, timing of the operation of a SERDES may be controlled by high-speed clock signals. Performance, accuracy or reliability of the SERDES may depend on frequency of the clock signals and drift or other variations in the phase relationships of clock signals can result in errors in received or transmitted data. Therefore, there is an ongoing need for new techniques that provide reliable lower-power clock generation and calibration circuits for components used to receive clock signals over high-speed serial links.

SUMMARY

Certain aspects of the disclosure relate to integrated circuit (IC) devices that include a bus interface. The bus interface may include a clock generation circuit that can automatically accommodate variances in process, voltage or temperature that affect transistors in a voltage-controlled oscillator (VCO).

In various aspects of the disclosure, the clock generation circuit has a VCO that includes a first transistor pair coupled in series between a power rail and ground, a replica transistor pair coupled in series between a reference node and ground, a current source having an output coupled to the reference node, the current source being further coupled to a control signal that determines an amplitude of current flowing through the replica transistor pair, and a voltage regulator that has an input coupled to the reference node and that has an output coupled to the power rail. The voltage regulator is configured to maintain the power rail at a voltage level defined by the voltage level of the reference node. The replica transistor pair is collocated on an integrated circuit with the first transistor pair. Each transistor in the replica transistor pair has a same type as a corresponding transistor in the first transistor pair.

In various aspects of the disclosure, a method for generating clock signals includes configuring amplitude of a current provided by a current source to a replica transistor pair through a reference node, and providing power to a power rail of a VCO using a voltage regulator that is coupled to the reference node. The voltage regulator may be configured to maintain the power rail at a voltage level defined by the voltage level of the reference node. The VCO includes a first transistor pair coupled in series between the power rail and ground. The replica transistor pair is coupled in series between the reference node and ground and is collocated on an integrated circuit with the first transistor pair. Each transistor in the replica transistor pair may be of a same type as a corresponding transistor in the first transistor pair.

In various aspects of the disclosure, an apparatus includes means for providing a current to a replica transistor pair, means for configuring amplitude of the current provided to the replica transistor pair, and means for providing power to a power rail of a VCO. The means for providing the current to the replica transistor pair includes a current source that is coupled to the replica transistor pair at a reference node. The means for providing power to the power rail of the VCO includes a voltage regulator that has an input coupled to the reference node. The voltage regulator is configured to maintain the power rail at a voltage level defined by the voltage level of the reference node. The VCO includes a first transistor pair coupled in series between the power rail and ground. The replica transistor pair includes transistors coupled in series between the reference node and ground. The replica transistor pair may be collocated on an integrated circuit with the first transistor pair. Each transistor in the replica transistor pair is of a same type as a corresponding transistor in the first transistor pair.

In certain aspects, the VCO further includes a second transistor pair coupled in series between the power rail and ground. The first transistor pair may be cross-coupled with the second transistor pair.

In certain aspects, the first transistor pair includes an N-type metal-oxide-semiconductor (NMOS) transistor having a source that is coupled to ground, and a drain that is coupled to a first common node, and a P-type metal-oxide-semiconductor (PMOS) transistor having a source that is coupled to the power rail, and a drain that is coupled to the first common node. The replica transistor pair may include an NMOS transistor having a source that is coupled to ground, and a gate and a drain that are coupled at a second common node, and a PMOS transistor having a source that is coupled to the reference node, and a gate and a drain that are coupled to the second common node.

In certain aspects, the clock generation circuit includes a comparator having a first input coupled to a voltage reference signal and a second input coupled to the reference node; and a calibration circuit having an input coupled to an output of the comparator and provides the control signal to the current source. The current source may include a current digital to analog converter (IDAC) and the control signal may encode a multibit digital value. The calibration circuit may be configured to determine a process corner characterizing the replica transistor pair, and to select maximum and minimum values for the multibit digital value based on the process corner. The calibration circuit provides or configures the voltage reference signal.

In one aspect, manufacturing process variations may affect the replica transistor pair and the first transistor pair to the same extent.

In one aspect, the replica transistor pair may track the manufacturing process corner associated with the VCO by compensating for changes in performance or operation of the first transistor pair attributable to manufacturing process variances.

DETAILED DESCRIPTION

Figure 1:
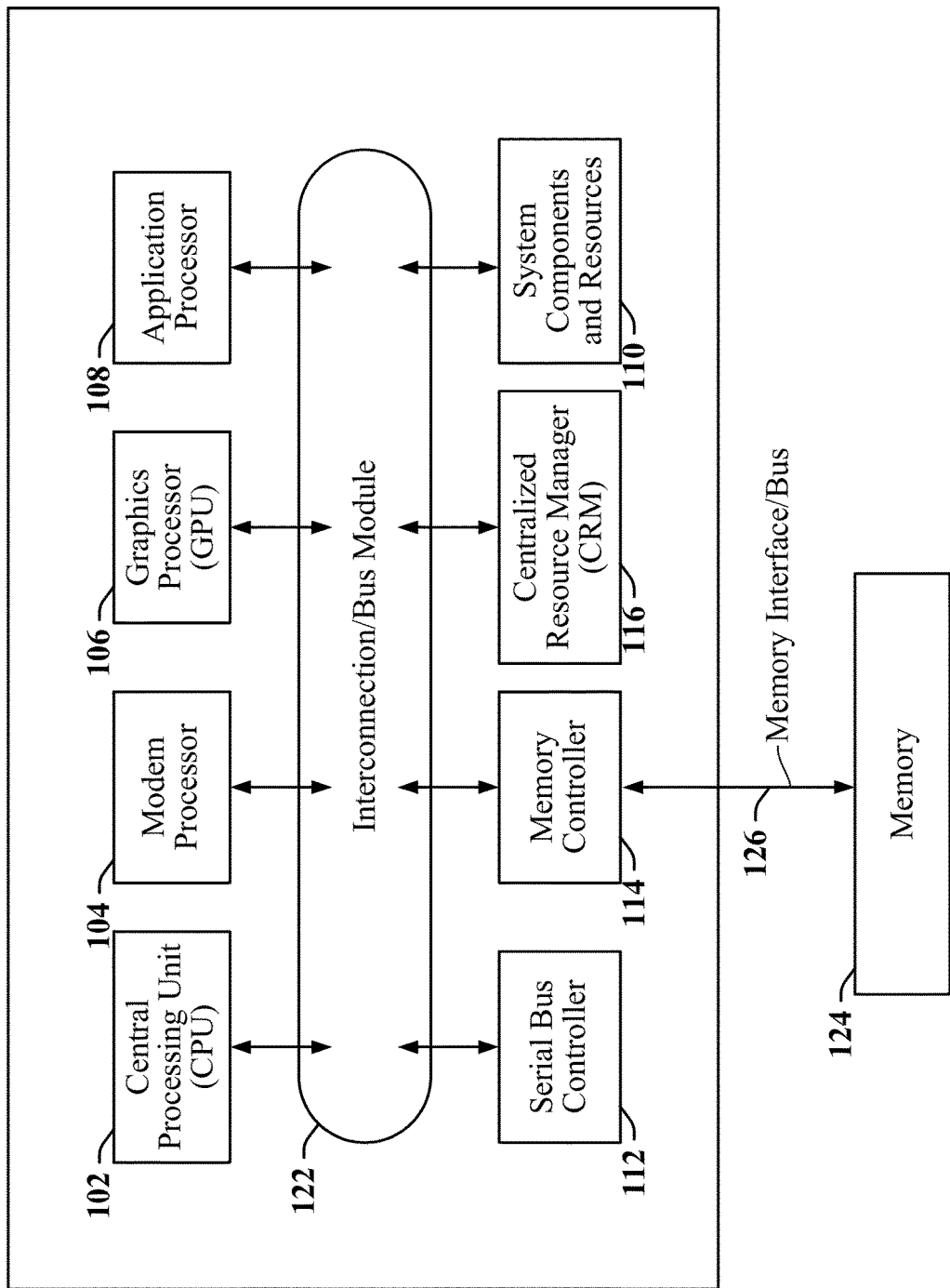
FIG. 1 illustrates an example of a system-on-a-chip in accordance with certain aspects of the present disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

Several aspects of the invention will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

Data communication links employed by system-on-a-chip (SoC) and other integrated circuit (IC) devices to connect processors with modems and other peripherals may be operated in accordance with industry or proprietary standards or protocols associated with certain functions or types of devices. According to certain aspects of the disclosure, a serial data link may be used to interconnect electronic devices that are subcomponents of an apparatus such as a cellular phone, a smart phone, a session initiation protocol (SIP) phone, a laptop, a notebook, a netbook, a smartbook, a personal digital assistant (PDA), a satellite radio, a global positioning system (GPS) device, a smart home device, intelligent lighting, a multimedia device, a video device, a digital audio player (e.g., MP3 player), a camera, a game console, an entertainment device, a vehicle component, a wearable computing device (e.g., a smart watch, a health or fitness tracker, eyewear, etc.), an appliance, a sensor, a security device, a vending machine, a smart meter, a drone, a multicopter, or any other similar functioning device.

Certain aspects of the disclosure are applicable to input/out (I/O) circuits that provide an interface between core circuits and memory devices. Many mobile devices employ Synchronous Dynamic Random Access Memory (SDRAM), including Low-Power Double Data Rate SDRAM, which may be referred to as low-power DDR SDRAM, LPDDR SDRAM or, in some instances, LPDDRx where x describes the technology generation of the LPDDR SDRAM. Later generations of LPDDR SDRAM designed to operate at higher operating frequencies may employ lower voltage levels in the core of an SoC or memory device to mitigate for increased power associated with the higher operating frequencies.

Process technology employed to manufacture semiconductor devices, including IC devices is continually improving. Process technology includes the manufacturing methods used to make IC devices and defines transistor size, operating voltages and switching speeds. Features that are constituent elements of circuits in an IC device may be referred as technology nodes and/or process nodes. The terms technology node, process node, process technology may be used to characterize a specific semiconductor manufacturing process and corresponding design rules. Faster and more power-efficient technology nodes are being continuously developed through the use of smaller feature size to produce smaller transistors that enable the manufacture of higher-density ICs.

Certain examples of circuits are illustrated herein as being implemented using P-type metal-oxide-semiconductor (PMOS) transistors, N-type metal-oxide-semiconductor (NMOS) transistors or some combination of NMOS and PMOS transistors. These circuits are provided by way of example only, and it is contemplated that the concepts disclosed herein can be implemented in circuits that use various other combinations of NMOS and PMOS transistors.

FIG. 1 illustrates an example of an apparatus 100 in which certain components and interconnections are implemented in an SoC. The SoC may include or be coupled to a memory interface/bus 126 that can be adapted according to certain aspects of the present disclosure. The apparatus 100 may include a number of heterogeneous processors, such as a central processing unit (CPU) 102, a modem processor 104, a graphics processor 106, and an application processor 108. Each processor 102, 104, 106, 108, may include one or more cores, and each processor/core may perform operations independent of the other processors/cores. The processors 102, 104, 106, 108 may be organized in close proximity to one another (e.g., on a single substrate, die, integrated chip, etc.) so that the processors may operate at a much higher frequency/clock rate than would be possible if the signals were to travel off-chip. The proximity of the cores may also allow for the sharing of on-chip memory and resources (e.g., voltage rails), as well as for more coordinated cooperation between cores.

The apparatus 100 may include system components and resources 110 for managing sensor data, analog-to-digital conversions, and/or wireless data transmissions, and for performing other specialized operations (e.g., decoding high-definition video, video processing, etc.). System components and resources 110 may also include components such as voltage regulators, oscillators, phase-locked loops (PLLs), peripheral bridges, data controllers, system controllers, access ports, timers, and/or other similar components used to support the processors and software clients running on the computing device. The system components and resources 110 may also include circuitry for interfacing with peripheral devices, such as cameras, electronic displays, wireless communication devices, external memory chips, etc.

The apparatus 100 may further include a serial bus controller 112 such as a Universal Serial Bus (USB) controller, one or more memory controllers 114, and a centralized resource manager (CRM) 116. The apparatus 100 may also include an input/output module (not illustrated) for communicating with resources external to the SoC, each of which may be shared by two or more of the internal SoC components.

The processors 102, 104, 106, 108 may be interconnected to the serial bus controller 112, the memory controller 114, system components and resources 110, CRM 116, and/or other system components via an interconnection/bus module 122, which may include an array of reconfigurable logic gates and/or implement a bus architecture. Communications may also be provided by advanced interconnects, such as high-performance networks on chip (NoCs).

The interconnection/bus module 122 may include or provide a bus mastering system configured to grant SoC components (e.g., processors, peripherals, etc.) exclusive control of the bus (e.g., to transfer data in burst mode, block transfer mode, etc.) for a set duration, number of operations, number of bytes, etc. In some cases, the interconnection/bus module 122 may implement an arbitration scheme to prevent multiple master components from attempting to drive the bus simultaneously. The memory controller 114 may be a specialized hardware module configured to manage the flow of data to and from a memory 124 via the memory interface/bus 126.

The memory controller 114 may comprise one or more processors configured to perform read and write operations with the memory 124. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In certain aspects, the memory 124 may be part of the apparatus 100.

Figure 2:
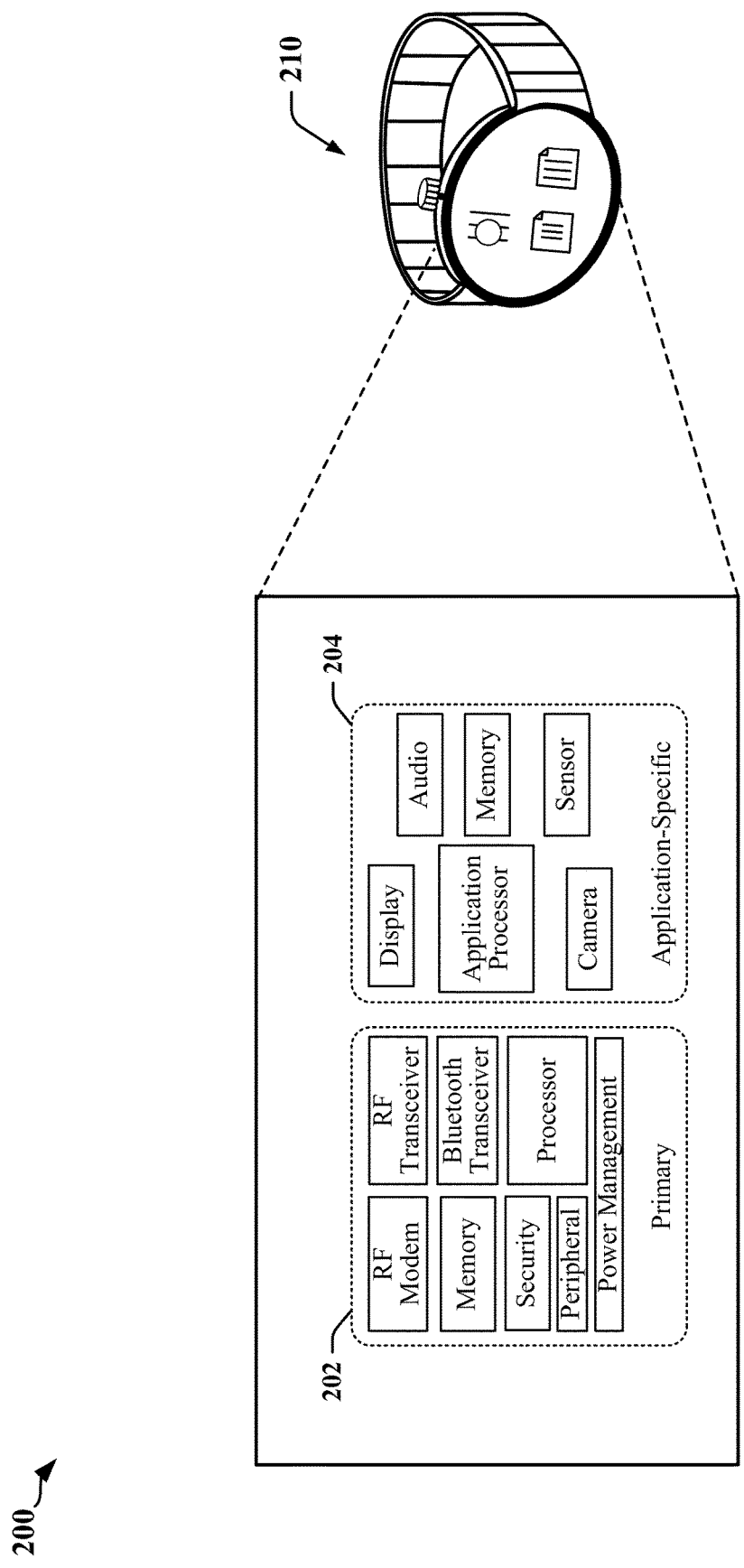
FIG. 2 illustrates an apparatus employing interconnected chiplets.

FIG. 2 illustrates an example of an apparatus 200 in which certain components are implemented using multiple chiplets that are interconnected using one or more data communication buses. In one example, the apparatus 200 may be enclosed within a wearable device a portable or wearable processing and/or communication device (each of which being referred to herein as a portable communication device or PCD), sensors, instruments, appliances and other such devices include one or more ICs. These devices may include mobile phones, tablet computers, palmtop computers, portable digital assistants (PDAs), portable game consoles, and other portable electronic devices such as the illustrated smartwatch 210. PCDs commonly contain integrated circuits or SoCs that include numerous components or subsystems designed to work together to deliver functionality to a user. The various SoC subsystems may communicate with each other via one or more intra-chip data buses or similar data communication interconnects. PCDs may have multiple SoCs that communicate with each other via similar inter-chip interconnects. The ICs are typically packaged in an IC package, which may be referred to as a "semiconductor package" or "chip package." The IC package typically includes a package substrate and one or more IC chips or other electronic modules mounted to the package substrate to provide electrical connectivity to the IC chips. For example, an IC chip in an IC package may be configured as an SoC. The IC chips are electrically coupled to other IC chips and/or to other components in the IC package through electrical coupling to metal lines in the package substrate. The IC chips can also be electrically coupled to other circuits outside the IC package through electrical connections of external metal interconnects (e.g., solder bumps) of the IC package.

Chiplet technology can be used to address some of the performance, power and size design requirements for complex SoCs used in certain mobile or wearable devices. The block diagram in FIG. 2 illustrates certain aspects of an apparatus 200 that can be constructed using chiplets. The apparatus 200 may be configured by selecting a combination of chiplets that implement certain subsystems or distinct functional elements. In the illustrated example, the apparatus 200 includes a set of primary chiplets 202 that enable the apparatus 200 to perform core processing, security and communication functions. The set of primary chiplets 202 include a processor, memory and one or more modems. The illustrated apparatus 200 also includes a set of application-specific chiplets 204 that includes an application processor, display driver, camera interface and audio controller. In a remote sensing device or appliance, the audio-visual components could be omitted and may be replaced with analog-to-digital controllers, for example.

The apparatus 200 may include a variety of processing engines, such as central processing units (CPUs) with multiple cores, graphical processing units (GPUs), digital signal processors (DSPs), neural processing units (NPUs), wireless transceiver units (also referred to as modems), peripherals, display and imaging interfaces, etc. Each of these subsystems and other functional elements can be implemented as an individual chiplet, or as a combination of chiplets. The chiplets included in the apparatus 200 can be proprietary or may be acquired from a variety of sources. An SoC may be constructed from chiplets manufactured at different process nodes and/or operated at different voltages.

Figure 3:
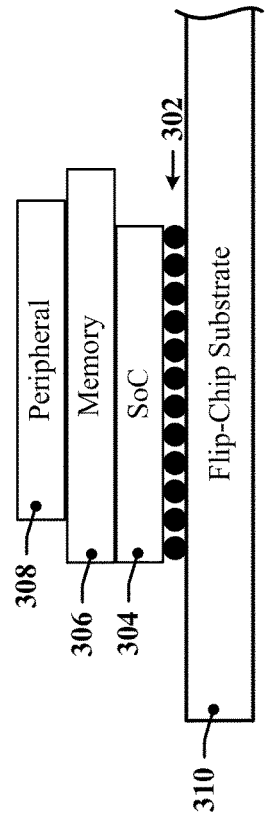
FIG. 3 illustrates an example of an apparatus in which chiplets are stacked vertically on a substrate.

FIG. 3 illustrates an example of an SoC 300 in which certain chiplets 304, 306, 308 are stacked vertically on a substrate 310. Some chiplets can be included in stacks that are deployed across the surface of the substrate 310, while other chiplets may be individually mounted on the surface of the substrate. Chiplets may be mounted on the surface of the substrate using solder balls 302 that provide electrical and/or thermal coupling between substrate and the mounted chiplets. An interconnect structure may be formed that enables chiplets 304, 306, 308 in a stack of chiplets to communicate with one another, with other chiplets mounted on the substrate 310 and with input/output structures that connect the apparatus 200 with other circuits, displays, imaging sensors and other peripherals with an apparatus.

The use of chiplets can reduce the areal size of the substrate 310 and increase three-dimensional packing density. The constituent chiplets may provide complex features and high performance within a smaller form-factor operated at lower power specifications. Moreover, each chiplet may define multiple power domains, operate at different frequencies and different chiplets may manage power/frequency modes independently and. In some instances, two or more chiplets may be operated in mutually exclusive power states. Additionally, operating conditions for an SoC depend on the type, number and arrangement of chiplets included on the substrate in addition to the modes of operation defined by applications. It is necessary to consider power usage by all chiplets in the SoC in order to ensure compliance with power budgets assigned for an application or device.

Conventional chiplet-based implementations suffer from limitations that include complex or difficult interconnect routing, local hotspots arising from routing congestion caused by connection architecture and challenges to signal timing specifications. In certain examples, local hotspots can arise from routing congestion, increased feature complexity and circuit concentrations. In certain examples, signal timing specifications can be compromised due to the necessity for an increased number of isolation clamps due to logic placement, number of voltage domains and reduced floorplan. Long wire crossings between chiplets can cause routing congestion.

Each chiplet in an SoC may be included to perform a specific function or type of function and the configuration of the chiplets can introduce further complexities and challenges for designers. For example, one chiplet may include radio frequency front end circuits that produce high frequency signals ranging up to 5 GHz or more, and may further include interfaces that are used by low-frequency power management circuits. A designer may import previously defined circuit blocks to implement some of the internal functions. These circuit blocks may be referred to as macros. Imported circuit blocks for a given process technology may be described, characterized or defined by a set of masks, hardware description language, specifications and test data. Commercially available or proprietary circuit blocks may be referred to as hard macros. Hard macros are tested and verified for a set of design and operating specifications. It is common for hard macros and other circuit blocks to define multiple power domains.

Figure 4:
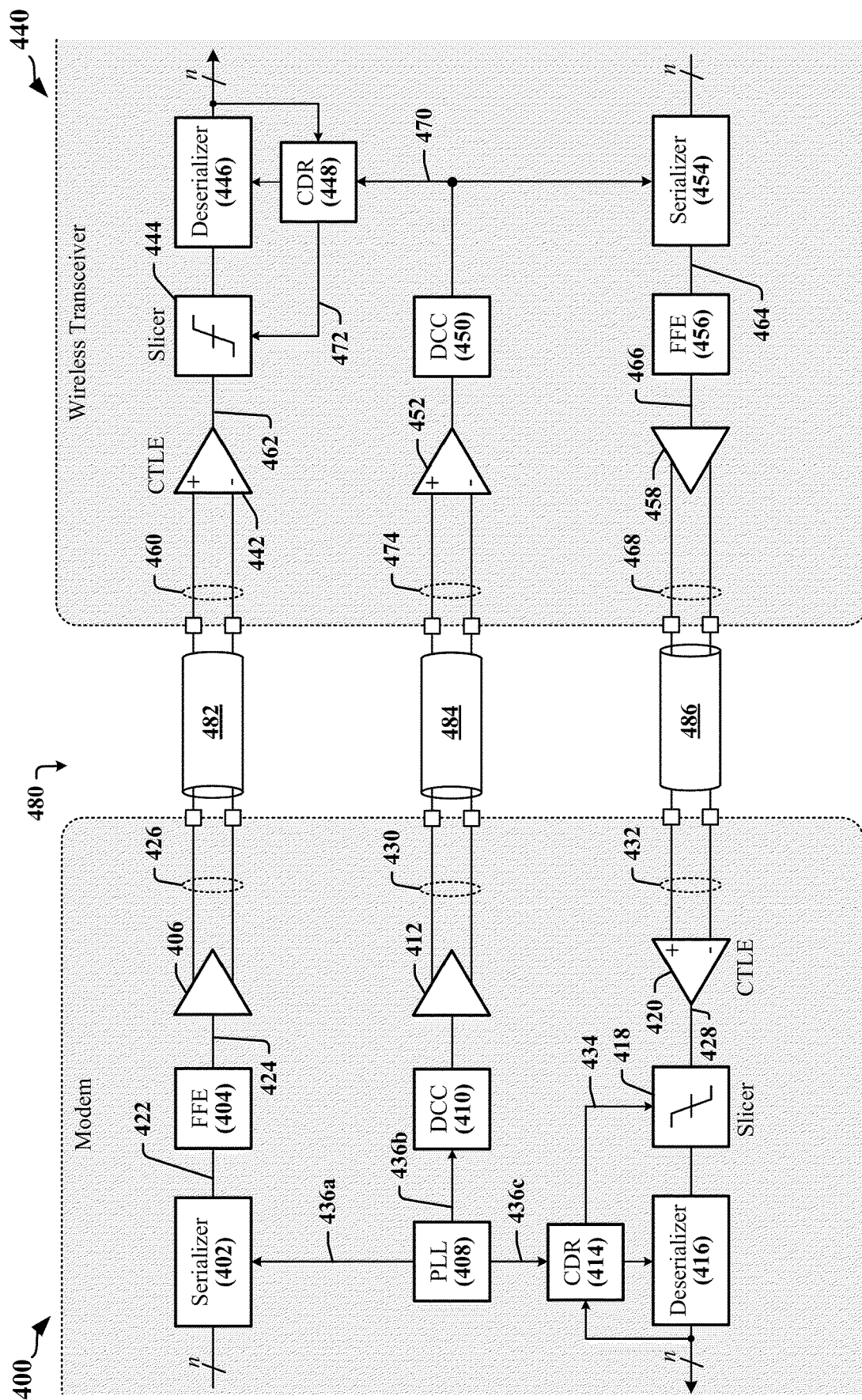
FIG. 4 illustrates an example of a system that employs a multi-channel data communication link.

FIG. 4 illustrates an example of a system that employs a multi-channel data communication link 480 to couple a modem 400 with a wireless transceiver 440. The data communication link 480 includes data channels 482 and 486 and a clock channel 484 that provide a transmission medium through which signals propagate between devices. In the illustrated example, a modem 400 transmits data in a first signal over a first data channel 482 to a wireless transceiver 440 and receives data in a second signal transmitted over a second data channel 486. Data signals are transmitted over the data channels 482 and 486 in accordance with timing information provided by a bus clock signal 430 transmitted over the clock channel 484.

The modem 400 may include a serializer 402 configured to convert n-bit parallel data elements, bytes or words into a serial data stream for transmission in a transmit data signal 422 over the first data channel 482. The transmit data signal 422 may be preconditioned by a pre-equalizing circuit, such as the illustrated digital feed-forward equalizer (the FFE 404), in order to combat or compensate for signal distortions attributable to inter-symbol interference (ISI), reflection and other effects that can be expected to limit bandwidth in first data channel 482. The preconditioned transmit data signal 424 output by the FFE 404 is provided to a driver circuit 406 that is configured drive the first data channel 482.

The modem 400 may include a serializer 402 configured to convert n-bit parallel data elements, bytes or words into a serial data stream for transmission in a serialized data signal 422. The serialized data signal 422 may be preconditioned by a pre-equalizing circuit, such as the illustrated digital feed-forward equalizer (the FFE 404), in order to combat or compensate for signal distortions attributable to inter-symbol interference (ISI), reflection and other effects that can be expected to limit bandwidth in the first data channel 482. A preconditioned data signal 424 output by the FFE 404 is provided to a driver circuit 406 that is configured generate and transmit a differential transmit data signal 426 over the first data channel 482. For the purposes of this disclosure, a differential signal includes two complementary signals that are phase-shifted by 180° with respect to one another.

The wireless transceiver 440 can be configured to process a data signal 460 received over the first data channel 482. The data signal 460 may be provided to a differential receiver 442, which may include or cooperate with an equalizing circuit. In one example, continuous time linear equalization (CTLE) may be used to compensate for certain losses experienced in the first data channel 482. The first data channel 482 may be characterized in some respects as a low-pass filter. In the illustrated example, the differential receiver 442 outputs an equalized data signal 462 that is sampled by a slicer 444. The slicer 444 may be implemented using a D-flipflop or the like and may be configured to capture signaling state of the equalized data signal 462 under the control of edges in a sampling clock signal 472 generated by a clock and data recovery (CDR) circuit 448. The output of the slicer 444 may be provided to a deserializer 446 that is clocked in accordance with one or more clock signals provided by the CDR circuit 448. The CDR circuit 448 may be configured to delay or phase shift a transceiver clock signal 470 to ensure that edges in the sampling clock signal 472 are timed to optimize sampling reliability.

In the illustrated wireless transceiver 440, the transceiver clock signal 470 is derived from a received bus clock signal 474 from the clock channel 484. A differential receiver 452 coupled to the clock channel 484 may be configured to equalize the received bus clock signal 474, and a duty cycle correction circuit 450 may be used to adjust the duty cycle of the transceiver clock signal 470. The transceiver clock signal 470 is provided to a serializer 454 that is configured to convert n-bit parallel data elements, bytes or words into a serial data stream for transmission in a serialized data signal 464. The serialized data signal 464 may be preconditioned by a pre-equalizing circuit, such as the illustrated FFE 456, in order to combat or compensate for signal distortions attributable to ISI, reflection and other effects that can be expected to limit bandwidth in the second data channel 486. A preconditioned data signal 466 output by the FFE 456 is provided to a driver circuit 458 that is configured generate and transmit a differential transmit data signal 468 over the second data channel 486.

The illustrated modem 400 can be configured to process a data signal 432 received over the second data channel 486. The data signal 432 may be provided to a differential receiver 420, which may include or cooperate with an equalizing circuit. In one example, CTLE may be used to compensate for certain losses experienced in the second data channel 486. The second data channel 486 may be characterized in some respects as a low-pass filter. In the illustrated example, the differential receiver 420 outputs an equalized data signal 428 that is sampled by a slicer 418. The slicer 418 may be implemented using a D-flipflop or the like and may be configured to capture signaling state of the equalized data signal 428 under the control of edges in a sampling clock signal 434 generated by a CDR circuit 414. The output of the slicer 418 may be provided to a deserializer 416 that is clocked in accordance with one or more clock signals provided by the CDR circuit 414. The CDR circuit 414 may be configured to delay or phase shift a transmitter clock signal to ensure that edges in the sampling clock signal 434 are timed to optimize sampling reliability.

A clock generation circuit, including the illustrated PLL 408, may generate multiple clock signals 436a, 436b, 436c used by the modem 400. One or more of the clock signals 436a, 436b, 436c may be a divided version of a base clock signal generated by the PLL 408. One or more of the clock signals 436a, 436b, 436c may be phase shifted with respect to the base clock signal. In one example, the serializer 402 may produce the serialized data signal 422 using timing provided by a first clock signal 436a. In another example, the bus clock signal 430 transmitted over the clock channel 484 may be derived from a second clock signal 436b. In some instances, a duty cycle correction circuit 410 may be used to adjust the duty cycle of the second clock signal 436b and to provide an input to a driver circuit 412 that is configured drive the clock channel 484. In another example, the CDR circuit 448 may generate the sampling clock signal 434 from a third clock signal 436c.

Communication specifications for high-speed clock signals used in certain later-generation chiplets require low jitter and reduced power consumption. In many implementations, a voltage-controlled oscillator (VCO) is used to generate a stable, adjustable high-frequency clock signal. Demanding jitter tolerances can be met using a VCO that includes a resonant circuit in a feedback loop. In many implementations, the resonant circuit includes an inductor and capacitor, and may be referred to as a tank circuit. The term "LC VCO" may be used to refer to a VCO that has a resonant circuit with an inductance (L) and capacitance (C). A voltage regulator may be used to lower jitter in the generated high-frequency clock signal by ensuring that power is supplied to the VCO at a stable voltage.

Figure 5:
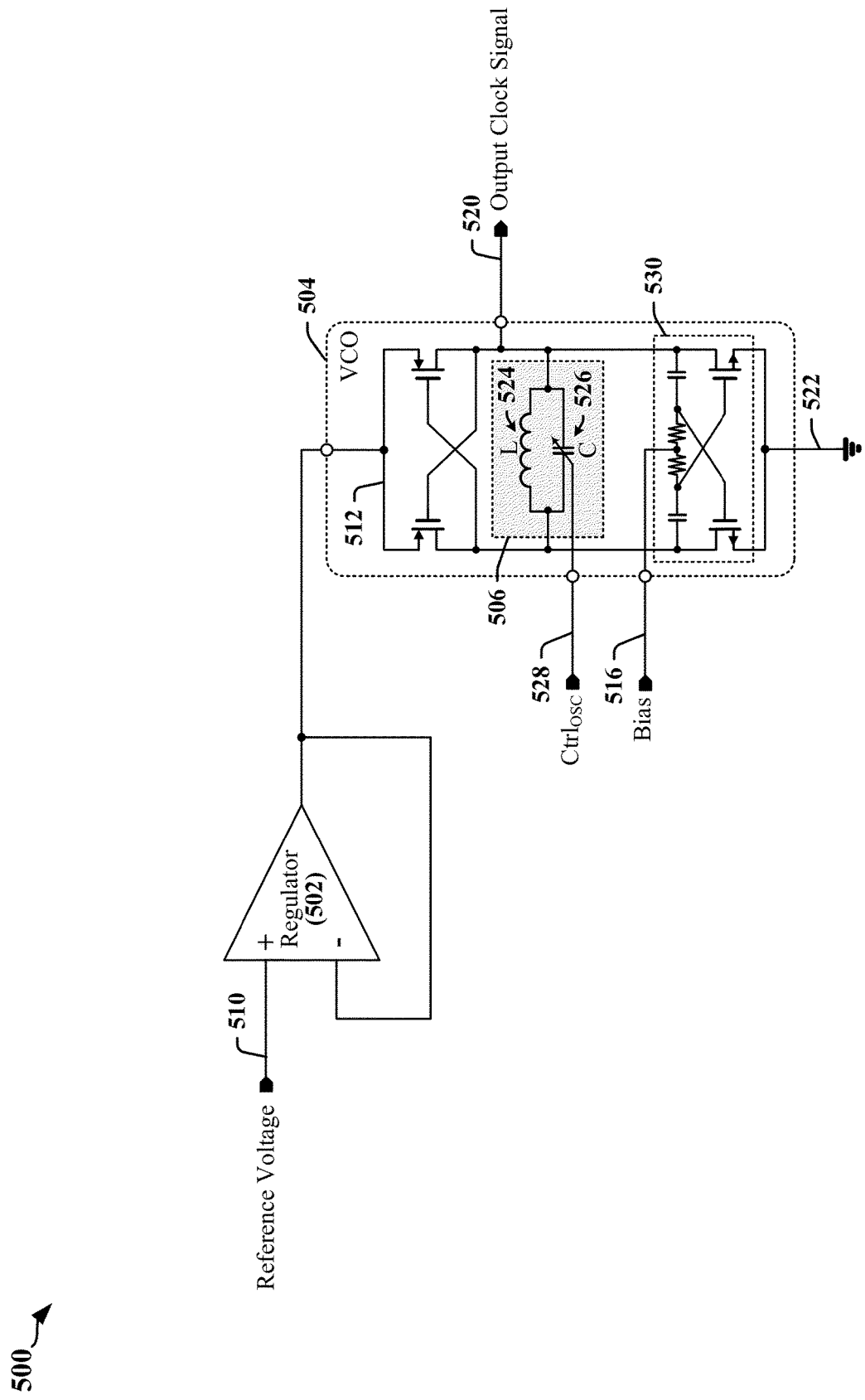
FIG. 5 illustrates an example of a high-frequency clock generation circuit that uses a regulator to control the voltage of power provided to a voltage-controlled oscillator.

FIG. 5 illustrates an example of a clock generation circuit 500 that uses a regulator 502 to control the voltage at which power is supplied to a VCO 504. In the illustrated example, power is supplied to the VCO 504 through a power rail 512 that may be provided for the sole use of the VCO 504 and associated circuits. The power rail 512 has a predefined nominal voltage level measured with respect to circuit ground 522. The regulator 502 tracks and adjusts voltage of the power rail 512 based on a comparison of its output voltage with a reference voltage 510. The reference voltage 510 may be defined by another power supply rail or a voltage reference circuit. A bias circuit block 530 in the VCO 504 is controlled by a bias input signal 516.

In the illustrated example, the VCO 504 includes an LC resonant circuit 506 that may be configured to produce a desired resonant frequency. The LC resonant circuit 506 has an inductor 524 (L) that is coupled in parallel with a variable capacitor 526 (C). In one example, the variable capacitor 526 includes multiple switched capacitors that can be coupled in parallel when corresponding switches are closed. The switches may respond to a multibit control signal 528 that can configure the capacitance value provided by the variable capacitor 526 and thereby control the oscillation frequency of the VCO 504 and the frequency of the output clock signal 520.

Configuring the regulator 502 to conform output voltage to a fixed reference voltage 510 can produce sub-optimal performance of the VCO 504 when manufacturing process, voltage or temperature (PVT) variations affect the operation of transistors and other components in an IC device. For example, process variances attributable to device manufacturing processes can affect components of the VCO 504 can result in differences in impedance and/or switching speed of transistors. These differences can impact resonant frequency and cause different instances of the VCO 504 to produce output clock signals 520 with different frequencies under identical voltage and temperature conditions, including at process corners that indicate outer limits for certain process parameters. Process corners may be defined by manufacturing tolerances and can be used to calculate ranges of performance level for all possible combinations of process variations.

A VCO implemented in accordance with certain aspects of this disclosure receives a power supply from a low dropout (LDO) voltage regulator that automatically adjusts its output to accommodate process variations affecting components of the VCO. The LDO voltage regulator can optimize performance across all process corners. For the purposes of this disclosure, the term "LDO voltage regulator" may refer to a voltage regulator that can produce an output at a configured direct current (DC) voltage from a power supply that provides an input to the voltage regulator at a voltage level that is close to the voltage level of the output voltage.

Figure 6:
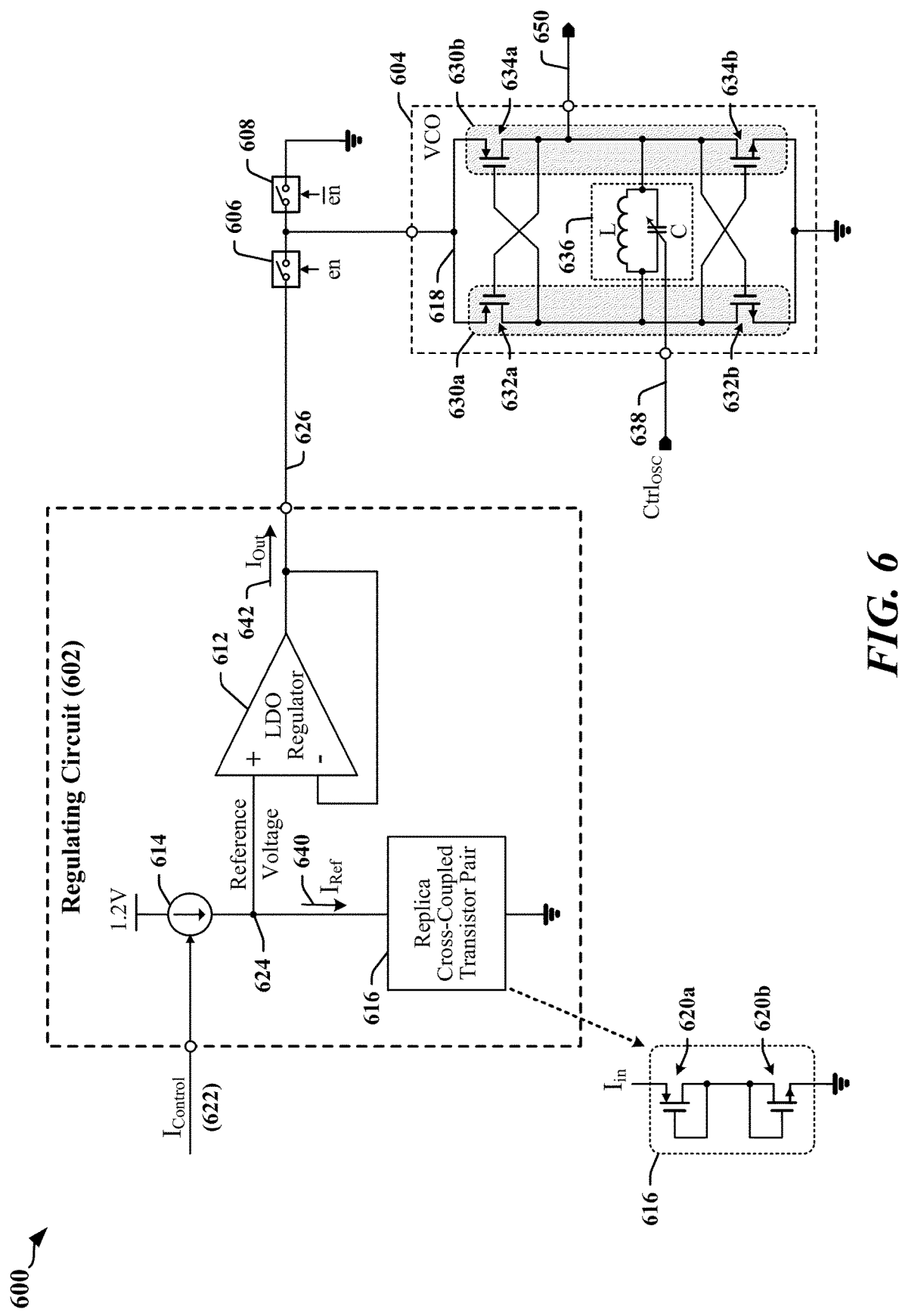
FIG. 6 illustrates a first example of a high-frequency clock generation circuit that is configured in accordance with certain aspects of this disclosure.

FIG. 6 illustrates a first example of a high-frequency clock generation circuit 600 that is configured in accordance with certain aspects of this disclosure. The clock generation circuit 600 generates an output that is a function of the process corners associated with one or more devices in a VCO 604. The output 626 of a regulating circuit 602 is coupled to a power rail 618 of the VCO 604 through a switch 606 when the switch 606 is turned on and a second switch 608 is turned off. The power rail 618 of the VCO 604 is coupled to Ground when a second switch 608 is turned on, and switch 606 is turned off. The regulating circuit 602 includes a voltage regulator 612, which may be a low dropout (LDO) voltage regulator. The voltage regulator 612 locks the output 626 of the regulating circuit 602 to a reference voltage level that is defined using a current source 614 and a replica cross-coupled transistor pair 616.

The current source 614 may be implemented using a current digital-to-analog converter (IDAC) that is configured by a control signal ($I_{Control}$ 622). In one example, $I_{Control}$ 622 is a multibit signal that encodes a multibit codeword. The current source 614 outputs a current ($I_{Ref}$ 640) that has an amplitude defined by $I_{Control}$ 622. The output of the current source 614 is coupled to the replica cross-coupled transistor pair 616 through a reference node 624. The reference voltage level corresponds to the voltage at the reference node 624, which in turn corresponds to the voltage dropped across the replica cross-coupled transistor pair 616.

In the illustrated example, the replica cross-coupled transistor pair 616 is a replica of two cross-coupled transistor pairs 630a, 630b in the VCO 604. The replica cross-coupled transistor pair 616 includes two transistors 620a, 620b that are coupled in series between the reference node 624 and Ground. The cross-coupled transistor pair 630a includes two transistors 632a, 632b that are coupled in series between the power rail 618 of the VCO 604 and Ground. The cross-coupled transistor pair 630b includes two transistors 634a, 634b that are coupled in series between the power rail 618 of the VCO 604 and Ground. For the purposes of this description, the transistors 620a, 620b may be considered a replica of a cross-coupled transistor pair 630a or 630b in the VCO 604 when each transistor 620a or 620b is manufactured by the same process as its corresponding transistor 632a or 632b, and/or 634a or 634b, and when transistors 620a, 620b are coupled together in the same configuration as transistors 632a, 632b or 634a, 634b. In some implementations, the transistors 620a, 620b are constructed on an IC device in physical proximity to the transistors 632a, 632b or 634a, 634b of at least one cross-coupled transistor pair 630a or 630b in the VCO 604. The transistors 620a, 620b in the replica cross-coupled transistor pair 616 may be considered to be collocated with the transistors 632a, 632b and/or 634a, 634b when transistors 620a, 620b are constructed on an IC device in physical proximity to transistors 632a, 632b and/or 634a, 634b or when the 620a, 620b are expected to be subject to the manufacturing process, voltage and/or temperature (PVT) variations as transistors 632a, 632b and/or 634a, 634b.

In the illustrated example, a PMOS transistor 620a is coupled in series with an NMOS transistor 620b. The gates of transistors 620a, 620b are coupled to their respective drains and the transistors 620a, 620b are turned on. The source of PMOS transistor 620a receives an input current from the current source 614 and the source of NMOS transistor 620b is coupled to Ground. The drains of the transistors 620a, 620b are coupled together. The amplitude of the current flowing through the transistors 620a, 620b is nominally equal to the amplitude of $I_{Ref}$ 640. The output 626 of the voltage regulator 612 tracks the reference voltage level which corresponds to the voltage at the source of PMOS transistor 620a.

The combination and structure of transistors 632a, 632b may be repeated multiple (k) times within the VCO 604. The illustrated VCO 604 includes a first cross-coupled transistor pair 630a that includes PMOS transistor 632a that is coupled in series with NMOS transistor 632b such that the drains of the transistors 632a, 632b are coupled together. The source of PMOS transistor 632a is coupled to the power rail 618 and receives an input current from the regulating circuit 602 and the source of the NMOS transistor 632b is coupled to Ground. The illustrated VCO 604 also includes a second cross-coupled transistor pair 630b that includes PMOS transistor 634a that is coupled in series with NMOS transistor 634b such that the drains of the transistors 634a, 634b are coupled together. The source of PMOS transistor 634a is coupled to the power rail 618 and receives an input current from the regulating circuit 602 and the source of NMOS transistor 634b is coupled to Ground.

The amplitude of $I_{Ref}$ 640 can be used to reliably configure the voltage level of the power rail 618. The voltage applied to each cross-coupled transistor pair 630a, 630b can be expected to cause a current nominally equal to $I_{Ref}$ 640 to flow through each of the cross-coupled transistor pairs 630a, 630b. In the general case where the VCO 604 includes k cross-coupled transistor pairs, the current ($I_{Out}$ 642) flowing from the voltage regulator 612 can be estimated as $I_{out}$=k× $I_{Ref}$. Other circuits in the VCO 604 may draw current from the power rail 618 and may alter the amplitude of $I_{Out}$ 642, but are not expected to affect the relationship between $I_{Ref}$ 640 and the voltage level of the power rail 618.

The replica cross-coupled transistor pair 616 can track the process corner characterizing am instance of the VCO 604. By tracking the process corner for the VCO 604, the replica cross-coupled transistor pair 616 can optimize power rail voltage level and operating point for the VCO 604. The voltage across each cross-coupled transistor pair 630a, 630b can be expected to be the same as the voltage across the replica cross-coupled transistor pair 616, including in the presence of PVT variances. PVT variances, including manufacturing process variances, can be expected to affect the cross-coupled transistor pairs 630a, 630b of the VCO 604 and replica cross-coupled transistor pair 616 to the same extent. Accordingly, the replica transistor pair 616 can track the process corner associated with the VCO 604 by accommodating or compensating for changes in performance or operation of the transistor pairs 630a, 630b attributable to manufacturing process variances. In one example, the voltage across the replica cross-coupled transistor pair 616 for a given $I_{Ref}$ 640 can be expected to equal to the voltage level of the power rail 618 provided to the transistor pairs 630a, 630b of the VCO 604 regardless of process corner.

The use of the replica cross-coupled transistor pair 616 to control voltage level of the power rail 618 in the VCO 604 may be considered to be an open-loop system. The voltage on the power rail 618 is determined by the current produced by the current source 614, which can be configured during a calibration process that can account for process variations. Certain aspects of this disclosure relate to the provision of a calibration system that can limit variations in the voltage level of the power rail 618 in the VCO 604 by applying certain restraints to the configuration of the current source 614.

Figure 7:
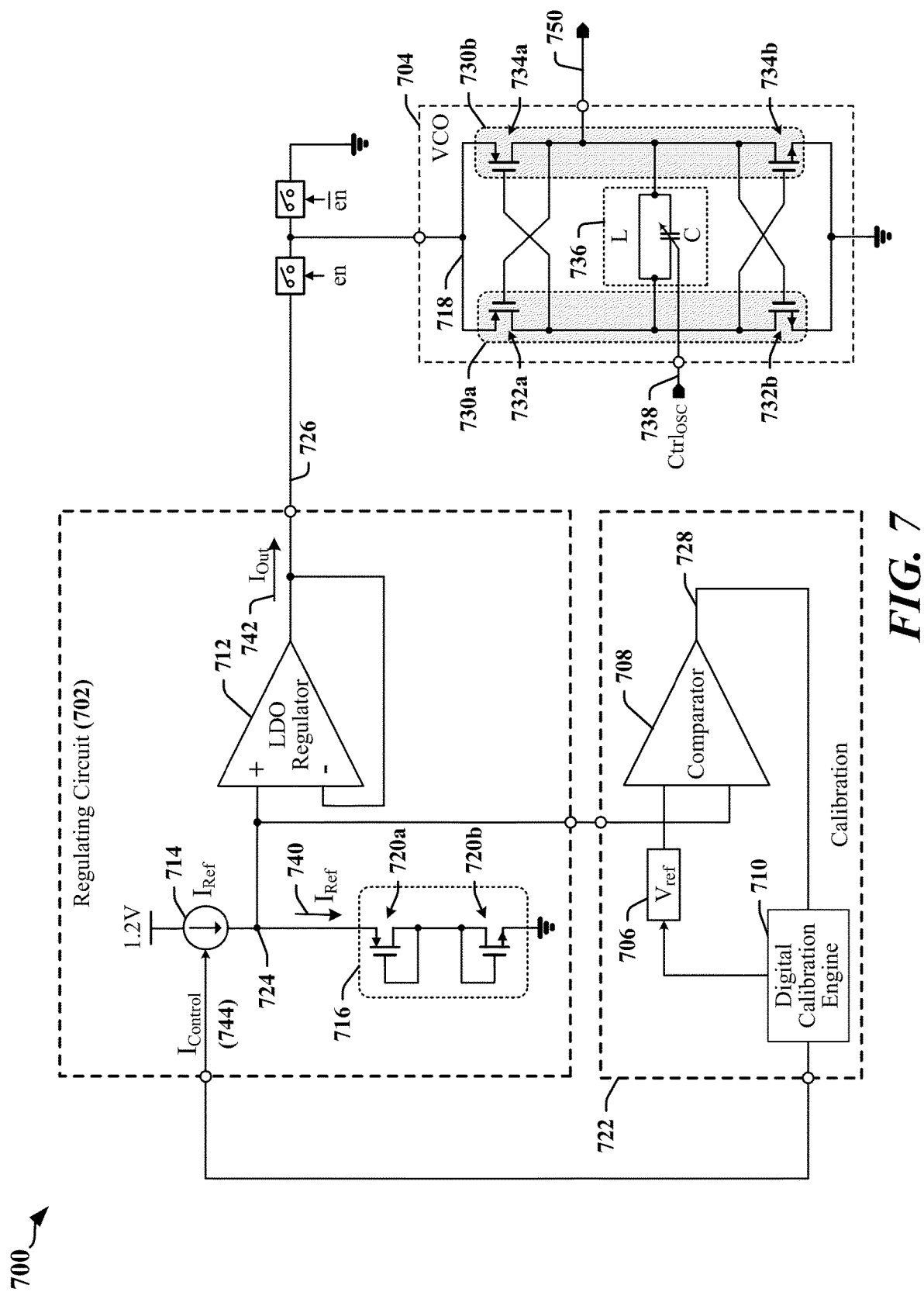
FIG. 7 illustrates a second example of a high-frequency clock generation circuit that is configured in accordance with certain aspects of this disclosure.

FIG. 7 illustrates a second example of a high-frequency clock generation circuit 700 that is configured in accordance with certain aspects of this disclosure. The clock generation circuit 700 generates an output that is a function of the process corners associated with one or more devices in a VCO 704. The output 726 of a regulating circuit 702 is coupled to a power rail 718 of the VCO 704. The regulating circuit 702 includes a voltage regulator 712, which may be a LDO voltage regulator. The voltage regulator 712 locks the output 726 of the regulating circuit 702 to a reference voltage level that is defined using a current source 714 and a replica cross-coupled transistor pair 716.

The current source 714 may be implemented using an IDAC that is configured by a control signal ($I_{Control}$ 744). In one example, $I_{Control}$ 744 is a multibit signal that encodes a multibit codeword. The current source 714 outputs a current ($I_{Ref}$ 740) that has an amplitude defined by $I_{Control}$ 744. The output of the current source 714 is coupled to the replica cross-coupled transistor pair 716 through a reference node 724. The reference voltage level corresponds to the voltage at the reference node 724, which in turn corresponds to the voltage dropped across the replica cross-coupled transistor pair 716.

In the illustrated example, the replica cross-coupled transistor pair 716 is a replica of two cross-coupled transistor pairs 730a, 730b in the VCO 704. The replica cross-coupled transistor pair 716 includes two transistors 720a, 720b that are coupled in series between the reference node 724 and Ground. The cross-coupled transistor pair 730a includes two transistors 732a, 732b that are coupled in series between the power rail 718 of the VCO 704 and Ground. The cross-coupled transistor pair 730b includes two transistors 734a, 734b that are coupled in series between the power rail 718 of the VCO 704 and Ground. For the purposes of this description, the transistors 720a, 720b may be considered a replica of a cross-coupled transistor pair 730a or 730b in the VCO 704 when each transistor 720a or 720b is manufactured by the same process as its corresponding transistor 732a or 732b, and/or 734a or 734b, and when transistors 720a, 720b are coupled together in the same configuration as transistors 732a, 732b or 734a, 734b. In some implementations, the transistors 720a, 720b are constructed on an IC device in physical proximity to the transistors 732a, 732b or 734a, 734b of at least one cross-coupled transistor pair 730a or 730b in the VCO 704. The transistors 720a, 720b in the replica cross-coupled transistor pair 716 may be considered to be collocated with the transistors 732a, 732b and/or 734a, 734b when transistors 720a, 720b are constructed on an IC device in physical proximity to transistors 732a, 732b and/or 734a, 734b or when the 720a, 720b are expected to be subject to the manufacturing process, voltage and/or temperature (PVT) variations as transistors 732a, 732b and/or 734a, 734b.

In the illustrated example, a PMOS transistor 720a is coupled in series with an NMOS transistor 720b. The gates of transistors 720a, 720b are coupled to their respective drains and the transistors 720a, 720b are turned on. The source of PMOS transistor 720a receives an input current from the current source 714 and the source of NMOS transistor 720b is coupled to Ground. The drains of the transistors 720a, 720b are coupled together. The amplitude of the current flowing through the transistors 720a, 720b is nominally equal to the amplitude of $I_{Ref}$ 740. The output 726 of the voltage regulator 712 tracks the reference voltage level which corresponds to the voltage at the source of PMOS transistor 720a.

The combination and structure of transistors 732a, 732b may be repeated multiple (k) times within the VCO 704. The illustrated VCO 704 includes a first cross-coupled transistor pair 730a that includes PMOS transistor 732a that is coupled in series with NMOS transistor 732b such that the drains of the transistors 732a, 732b are coupled together. The source of PMOS transistor 732a is coupled to the power rail 718 and receives an input current from the regulating circuit 702 and the source of the NMOS transistor 732b is coupled to Ground. The illustrated VCO 704 also includes a second cross-coupled transistor pair 730b that includes PMOS transistor 734a that is coupled in series with NMOS transistor 734b such that the drains of the transistors 734a, 734b are coupled together. The source of PMOS transistor 734a is coupled to the power rail 718 and receives an input current from the regulating circuit 702 and the source of NMOS transistor 734b is coupled to Ground.

The amplitude of $I_{Ref}$ 740 can be used to reliably configure the voltage level of the power rail 718. The voltage applied to each cross-coupled transistor pair 730a, 730b can be expected to cause a current nominally equal to $I_{Ref}$ 740 to flow through each of the cross-coupled transistor pairs 730a, 730b. In the general case where the VCO 704 includes k cross-coupled transistor pairs, the current ($I_{Out}$ 742) flowing from the voltage regulator 712 can be estimated as $I_{out}$=k× $I_{Ref}$. Other circuits in the VCO 704 may draw current from the power rail 718 and may alter the amplitude of $I_{Out}$ 742, but are not expected to affect the relationship between $I_{Ref}$ 740 and the voltage level of the power rail 718.

The replica cross-coupled transistor pair 716 can track the process corner characterizing am instance of the VCO 704. By tracking the process corner for the VCO 704, the replica cross-coupled transistor pair 716 can optimize power rail voltage level and operating point for the VCO 704. The voltage across each cross-coupled transistor pair 730a, 730b can be expected to be the same as the voltage across the replica cross-coupled transistor pair 716, including in the presence of PVT variances. PVT variances, including manufacturing process variances, can be expected to affect the transistor pairs 730a, 730b of the VCO 704 and replica cross-coupled transistor pair 716 to the same extent. Accordingly, the replica transistor pair 716 can track the process corner associated with the VCO 704 by accommodating or compensating for changes in performance or operation of the transistor pairs 730a, 730b attributable to manufacturing process variances. In one example, the voltage across the replica cross-coupled transistor pair 716 for a given $I_{Ref}$ 740 can be expected to equal to the voltage level of the power rail 718 provided to the transistor pairs 730a, 730b of the VCO 704 regardless of process corner.

A calibration system used with the clock generation circuit 700 includes calibration circuits 722 that configures and controls the current source 714 in the regulating circuit 702. A comparator 708 generates a feedback signal 728 representative of the voltage difference between the voltage level of the reference node 724 and a voltage reference 706. The feedback signal 728 is provided to a digital calibration engine 710 that can be configured to generate a codeword that is provided to the current source 714 in $I_{Control}$ 744. In some implementations, the digital calibration engine 710 also configures, calibrates and/or controls a circuit that provides the voltage reference 706. In one example, the digital calibration engine 710 may be configured to impose limits on the range of the voltage level of the reference node 724.

Process tracking using the replica cross-coupled transistor pair 616 or 716 can result in the power rail 718 in the VCO 704 having a voltage level that deviates from a specified nominal voltage level by a proportion that exceeds tolerances defined for the VCO 704. These deviations can occur when unpredicted, unexpected or uncommon process variances occur that have an indeterminate effect on the cross-coupled transistor pairs 730a, 730b of the VCO 704 and that result in a voltage level of the reference node 724 and across the cross-coupled transistor pairs 730a, 730b that is not suitable for circuit operation. In one example, a power rail 718 that has an excessively high voltage level can exceed the voltage tolerances of the constituent transistors 732a, 732b, 734a, 734b. In another example, the transistors 732a, 732b, 734a, 734b may be unable to switch states at predefined operating frequencies when a power rail 718 that has an excessively low voltage level. In another example, the switching speed of transistors 732a, 732b, 734a, 734b may sufficiently altered to produce a clock signal with an acceptable or undesirable frequency when the power rail 718 has a voltage level that exceeds a specified maximum voltage or has a voltage that is less than a specified minimum voltage can exceed the voltage tolerances of the VCO 704.

The digital calibration engine 710 may be configured with calibration information accumulated for different IC devices and/or calibration information generated during previous calibrations of one or more clock generation circuits 700. In some implementations, the digital calibration engine 710 may access calibration information from external sources. In some implementations, the digital calibration engine 710 is configured during system integration, configuration and/or initialization procedures. The calibration information may include calibration information obtained for multiple process corners.

In some implementations, the digital calibration engine 710 may be configured to define limits for operating the current source 714. The limits may correspond to maximum or minimum current levels for $I_{Ref}$ 740. In one example, the limits are represented by maximum and minimum values of the multibit codeword provided in $I_{Control}$ 744 to the current source 714. The maximum and minimum values of the multibit codeword provided in $I_{Control}$ 744 may be indexed to process corner data. In some examples, the calibration engine may determine a process corner for the clock generation circuit 700 based on information obtained from one or more calibration procedures. For example, a process corner may be identified through the use of the comparator 708 to determine differences between measurements of the voltage of the reference node 724 and the voltage reference 706 for different values of $I_{Control}$ 744. Differences detected by the comparator 708 between voltage levels configured for the voltage reference 706 and corresponding measurements of the voltage of the reference node 724 obtained for one or more codewords can identify the current process corner. The identified process corner van be used to select upper and lower boundaries for the multibit codeword provided in $I_{Control}$ 744.

The clock generation circuit 600 or 700 can automatically adjust the output of the voltage regulator 612 or 712 as a function of process corner in the VCO 604 or 704. The process corner in the VCO 604 or 704 may be identified using the replica cross-coupled transistor pair 616 or 716. Controlling the output of the voltage regulator 612 or 712 in this manner can optimize power delivered to the VCO 604 or 704 regardless of process or process corners. The VCOs 604 and 704 can operate without the bias circuit block 530 included in the VCO 504 and associated bias input signal 516 illustrated in FIG. 5. The removal of the bias circuit block 530 can reduce power consumption of VCOs 604 and 704 with respect to the VCO 504 illustrated in FIG. 5. The removal of the bias circuit block 530 can also reduce phase noise in the VCOs 604 and 704 with respect to the VCO 504 illustrated in FIG. 5. Improved phase noise performance enables the VCOs 604 and 704 to support higher frequency operation than obtained from the VCO 504 illustrated in FIG. 5. In one example the power consumption of the VCOs 604 and 704 is reduced by more than 30% and phase noise is reduced by more than 6 dB. The simplified and optimized of the VCOs 604 and 704 can reduce jitter from the output clock signals 650, 750 generated by the VCOs 604, 704.

Each of the VCOs 604 and 704 includes an LC resonant circuit 636, 736 that may be configured to produce a desired resonant frequency. The LC resonant circuits 636, 736 may correspond to the LC resonant circuit 506 illustrated in FIG. 5 and may similarly respond to respective multibit control signal 638, 738 that can control the oscillation frequency of the VCOs 604, 704 and the frequency of the output clock signals 650, 750 by configuring variable capacitors in the LC resonant circuits 636, 736.

In one aspect of this disclosure, the use of the current source 614, 714 and replica cross-coupled transistor pair 616, 716 as a tracking mechanism enables the supply voltage provided on the power rail 618, 718 of the VCO 604, 704 to have an optimum voltage for operating the VCO 604, 704. In one example, the VCO 604, 704 requires and receives power at higher voltages for process corners characterized by slower transistors that nominal transistors. In another example, the VCO 604, 704 receives power at lower voltages for process corners characterized by faster transistors that nominal.

Figure 8:
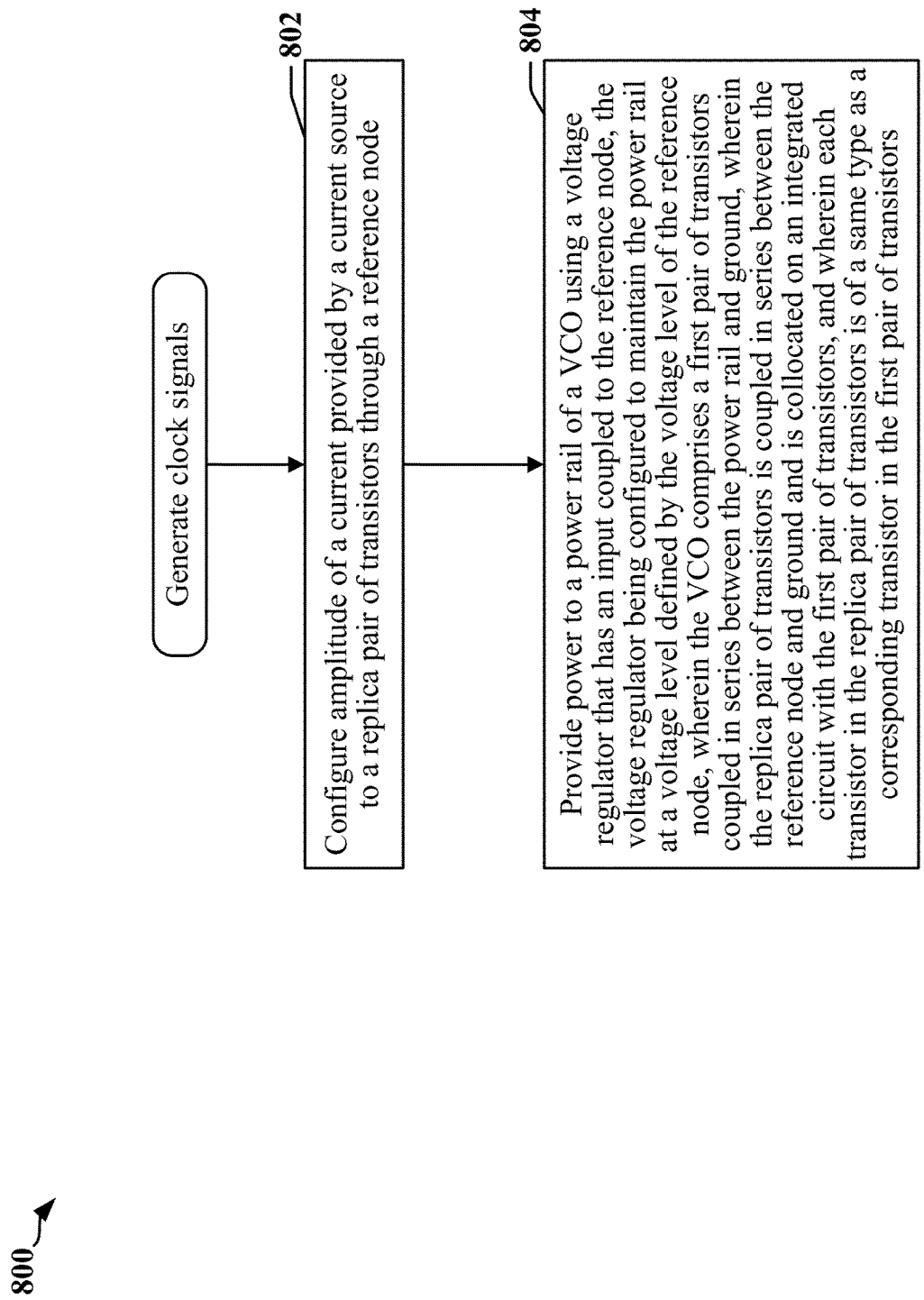
FIG. 8 is a flowchart of a method for generating clock signals in accordance with certain aspects of this disclosure.

FIG. 8 is a flowchart 800 of a method for generating clock signals in accordance with certain aspects of this disclosure. In some examples, the method includes using a LDO voltage regulator to provide power to a power rail of a VCO. In some instances, the method may be implemented by or involve the use of one or more processors or controllers.

At block 802 in the illustrated method, amplitude of a current provided by a current source to a replica transistor pair may be configured. The replica transistor pair may be coupled to the current source through a reference node. At block 804 in the illustrated method, power may be provided to a power rail of a VCO using a voltage regulator that has an input coupled to the reference node. The voltage regulator may be configured to maintain the power rail at a voltage level defined by the voltage level of the reference node. The VCO may include a first transistor pair coupled in series between the power rail and ground. The replica transistor pair may be coupled in series between the reference node and ground. The replica transistor pair may be collocated on an IC with the first transistor pair. Each transistor in the replica transistor pair may be of a same type as a corresponding transistor in the first transistor pair.

In some implementations, the VCO further includes a second transistor pair coupled in series between the power rail and ground. The first transistor pair may be cross-coupled with the second transistor pair. In one example of cross-coupling, the gate of each transistor in the first transistor pair is coupled to the drains of both transistors in the second transistor pair, and the gate of each transistor in the second transistor pair is coupled to the drains of both transistors in the first transistor pair.

In certain implementations, the first transistor pair includes an NMOS transistor and a PMOS transistor. In one example, the NMOS transistor has a source that is coupled to ground and a drain that is coupled to a first common node, and the PMOS transistor has a source that is coupled to the power rail and a drain that is coupled to the first common node. In this example, the replica transistor pair also includes an NMOS transistor and a PMOS transistor. The NMOS transistor has a source that is coupled to ground, and a gate and a drain that are coupled at a second common node and the PMOS transistor has a source that is coupled to the reference node, and a gate and a drain that are coupled to the second common node. In another example, the PMOS transistor in the first transistor pair has a source that is coupled to ground and a drain that is coupled to a first common node, and the NMOS transistor in the first transistor pair has a source that is coupled to the power rail and a drain that is coupled to the first common node, while the NMOS transistor in the replica transistor pair has a source that is coupled to ground, and a gate and a drain that are coupled at a second common node and the PMOS transistor in the replica transistor pair has a source that is coupled to the reference node, and a gate and a drain that are coupled to the second common node.

In certain implementations, a voltage reference signal may be compared with voltage level of the reference node. In some instances, the amplitude of the current provided by the current source may be configured using a result of comparison of the voltage reference signal and the voltage level of the reference node. In some instances, the amplitude of the current provided by the current source may be calibrated using a result of comparison of the voltage reference signal and the voltage level of the reference node. The current source may be implemented using an IDAC that is responsive to a multibit digital code. Maximum and minimum code values may be selected for the multibit digital code based on a process corner characterizing the replica transistor pair. The process corner may be determined during a calibration process that compares the voltage level of the reference node to the voltage reference signal while the voltage reference signal is changed and/or while the value of the multibit digital code voltage is changed. In some implementations, the voltage reference signal is configured based on the determined process corner.

Manufacturing process variations may affect the replica transistor pair and the first transistor pair to the same extent. The replica transistor pair may track a manufacturing process corner associated with the VCO by compensating for changes in performance or operation of the first transistor pair attributable to manufacturing process variances.

The method illustrated in FIG. 8 may be executed in an IC device. In one example, the IC device comprises an SoC. In another example, the IC device is included in one of multiple semiconductor dice mounted on a substrate. The IC device may be implemented as a chiplet in some instances. The IC device may include a bus interface. The bus interface may include a clock generation circuit that includes a VCO, a replica transistor pair, a current source and voltage regulator. The VCO may include a first transistor pair in which the transistors are coupled in series between a power rail and ground. The transistors in the replica transistor pair may be coupled in series between a reference node and ground. The replica transistor pair may be collocated on an IC device with the first transistor pair. Each transistor in the replica transistor pair may manufactured as the same type as a corresponding transistor in the first transistor pair. The replica transistor pair may be considered to be collocated on the IC device with the first transistor pair when both pairs of transistors are located in an area of the IC that is small enough to expect that the transistors in both pairs of transistors will be affected in substantially the same way by any variance in the manufacturing process.

The current source has an output coupled to the reference node. The current source may be further coupled to a control signal that determines an amplitude of current flowing through the replica transistor pair and/or through the reference node. In some examples, the voltage regulator is an LDO voltage regulator. The voltage regulator is coupled to the reference node and has an output that is coupled to the power rail. The voltage regulator may be configured to maintain the power rail at a voltage level defined by the voltage level of the reference node.

In some implementations, the VCO further includes a second transistor pair coupled in series between the power rail and ground. The first transistor pair may be cross-coupled with the second transistor pair. In one example of cross-coupling, the gate of each transistor in the first transistor pair is coupled to the drains of both transistors in the second transistor pair, and the gate of each transistor in the second transistor pair is coupled to the drains of both transistors in the first transistor pair.

In certain implementations, the first transistor pair includes an NMOS transistor and a PMOS transistor. In one example, the NMOS transistor has a source that is coupled to ground and a drain that is coupled to a first common node, and the PMOS transistor has a source that is coupled to the power rail and a drain that is coupled to the first common node. In this example, the replica transistor pair also includes an NMOS transistor and a PMOS transistor. The NMOS transistor has a source that is coupled to ground, and a gate and a drain that are coupled at a second common node and the PMOS transistor has a source that is coupled to the reference node, and a gate and a drain that are coupled to the second common node. In another example, the PMOS transistor in the first transistor pair has a source that is coupled to ground and a drain that is coupled to a first common node, and the NMOS transistor in the first transistor pair has a source that is coupled to the power rail and a drain that is coupled to the first common node, while the NMOS transistor in the replica transistor pair has a source that is coupled to ground, and a gate and a drain that are coupled at a second common node and the PMOS transistor in the replica transistor pair has a source that is coupled to the reference node, and a gate and a drain that are coupled to the second common node.

The clock generation circuit may also include a comparator and a calibration circuit. The comparator may have a first input coupled to a voltage reference signal and a second input coupled to the reference node. The calibration circuit may have an input coupled to an output of the comparator and provides the control signal to the current source. The current source may be included an IDAC, and the control signal may encode a multibit digital value that controls the output of the IDAC. The calibration circuit may be configured to determine a process corner characterizing the replica transistor pair, and select maximum and minimum values for the multibit digital value based on the process corner. The calibration circuit may provide or configure the voltage reference signal.

Typically, manufacturing process variations affect the replica transistor pair and the first transistor pair to the same extent. The replica transistor pair may track the manufacturing process corner associated with the VCO by compensating for changes in performance or operation of the first transistor pair attributable to manufacturing process variances.

Some implementation examples are described in the following numbered clauses:

1. A clock generation circuit, comprising: a voltage-controlled oscillator (VCO) comprising a first transistor pair coupled in series between a power rail and ground; a replica transistor pair coupled in series between a reference node and ground and collocated on an integrated circuit with the first transistor pair, each transistor in the replica transistor pair being of a same type as a corresponding transistor in the first transistor pair; a current source having an output coupled to the reference node, the current source being further coupled to a control signal that determines an amplitude of current flowing through the replica transistor pair; and a voltage regulator that has an input coupled to the reference node and that has an output coupled to the power rail, the voltage regulator being configured to maintain the power rail at a voltage level defined by the voltage level of the reference node.

2. The clock generation circuit as described in clause 1, wherein the VCO further comprises: a second transistor pair coupled in series between the power rail and ground, wherein the first transistor pair is cross-coupled with the second transistor pair.

3. The clock generation circuit as described in clause 1 or clause 2, wherein the first transistor pair comprises: an N-type metal-oxide-semiconductor (NMOS) transistor having a source that is coupled to ground, and a drain that is coupled to a first common node; and a P-type metal-oxide-semiconductor (PMOS) transistor having a source that is coupled to the power rail, and a drain that is coupled to the first common node.

4. The clock generation circuit as described in any of clauses 1-3, wherein the replica transistor pair comprises: an NMOS transistor having a source that is coupled to ground, and a gate and a drain that are coupled at a second common node; and a PMOS transistor having a source that is coupled to the reference node, and a gate and a drain that are coupled to the second common node.

5. The clock generation circuit as described in clause 1, further comprising: a comparator having a first input coupled to a voltage reference signal and a second input coupled to the reference node; and a calibration circuit having an input coupled to an output of the comparator and provides the control signal to the current source.

6. The clock generation circuit as described in clause 5, wherein the current source comprises a current digital to analog converter (IDAC) and the control signal encodes a multibit digital value.

7. The clock generation circuit as described in clause 6, wherein the calibration circuit is configured to: determine a process corner characterizing the replica transistor pair; and select maximum and minimum values for the multibit digital value based on the process corner.

8. The clock generation circuit as described in any of clauses 5-7, wherein the calibration circuit provides or configures the voltage reference signal.

9. The clock generation circuit as described in any of clauses 1-8, wherein manufacturing process variations affect the replica transistor pair and the first transistor pair to the same extent.

10. The clock generation circuit as described in any of clauses 1-9, wherein the replica transistor pair tracks a manufacturing process corner associated with the VCO by compensating for changes in performance or operation of the first transistor pair attributable to manufacturing process variances.

11. A method for generating clock signals, comprising: configuring amplitude of a current provided by a current source to a replica transistor pair through a reference node; and providing power to a power rail of a voltage-controlled oscillator (VCO) using a voltage regulator that has an input coupled to the reference node, the voltage regulator being configured to maintain the power rail at a voltage level defined by the voltage level of the reference node, wherein the VCO comprises a first transistor pair coupled in series between the power rail and ground, wherein the replica transistor pair is coupled in series between the reference node and ground and is collocated on an integrated circuit with the first transistor pair, and wherein each transistor in the replica transistor pair is of a same type as a corresponding transistor in the first transistor pair.

12. The method as described in clause 11, wherein the VCO further comprises a second transistor pair coupled in series between the power rail and ground, and wherein the first transistor pair is cross coupled with the second transistor pair.

13. The method as described in clause 11 or clause 12, wherein the first transistor pair comprises: an N-type metal-oxide-semiconductor (NMOS) transistor having a source that is coupled to ground, and a drain that is coupled to a first common node; and a P-type metal-oxide-semiconductor (PMOS) transistor having a source that is coupled to the power rail, and a drain that is coupled to the first common node.

14. The method as described in any of clauses 11-13, wherein the replica transistor pair comprises: an NMOS transistor having a source that is coupled to ground, and a gate and a drain that are coupled at a second common node; and a PMOS transistor having a source that is coupled to the reference node, and a gate and a drain that are coupled to the second common node.

15. The method as described in any of clauses 11-14, further comprising: comparing a voltage reference signal with voltage level of the reference node; and configuring the amplitude of the current provided by the current source using a result of comparing the voltage reference signal with the voltage level of the reference node.

16. The method as described in any of clauses 11-15, further comprising: comparing a voltage reference signal with voltage level of the reference node; and calibrating the amplitude of the current provided by the current source using a result of comparing the voltage reference signal with the voltage level of the reference node.

17. The method as described in clause 16, wherein the current source comprises a current digital to analog converter (IDAC) responsive to a multibit digital code.

18. The method as described in clause 17, further comprising: determining a process corner characterizing the replica transistor pair; and selecting maximum and minimum values for the multibit digital code based on the process corner.

19. The method as described in clause 18, further comprising: configuring the voltage reference signal based on the process corner.

20. The method as described in any of clauses 11-19, wherein manufacturing process variations affect the replica transistor pair and the first transistor pair to the same extent.

21. The method as described in any of clauses 11-20, wherein the replica transistor pair tracks a manufacturing process corner associated with the VCO by compensating for changes in performance or operation of the first transistor pair attributable to manufacturing process variances.

22. An apparatus, comprising: means for providing a current to a replica transistor pair, including a current source that is coupled to the replica transistor pair at a reference node; means for configuring amplitude of the current provided to the replica transistor pair; and means for providing power to a power rail of a voltage-controlled oscillator (VCO), including a voltage regulator that has an input coupled to the reference node, the voltage regulator being configured to maintain the power rail at a voltage level defined by the voltage level of the reference node, wherein the VCO comprises a first transistor pair coupled in series between the power rail and ground, wherein the replica transistor pair includes transistors coupled in series between the reference node and ground, wherein the replica transistor pair is collocated on an integrated circuit with the first transistor pair, and wherein each transistor in the replica transistor pair is of a same type as a corresponding transistor in the first transistor pair.

23. The apparatus as described in clause 22, wherein the VCO further comprises a second transistor pair coupled in series between the power rail and ground, and wherein the first transistor pair is cross coupled with the second transistor pair.

24. The apparatus as described in clause 22 or clause 23, wherein the first transistor pair comprises: an N-type metal-oxide-semiconductor (NMOS) transistor having a source that is coupled to ground, and a drain that is coupled to a first common node; and a P-type metal-oxide-semiconductor (PMOS) transistor having a source that is coupled to the power rail, and a drain that is coupled to the first common node.

25. The apparatus as described in any of clauses 22-24, wherein the replica transistor pair comprises: an NMOS transistor having a source that is coupled to ground, and a gate and a drain that are coupled at a second common node; and a PMOS transistor having a source that is coupled to the reference node, and a gate and a drain that are coupled to the second common node.

26. The apparatus as described in any of clauses 22-25, wherein the means for configuring the amplitude of the current is configured to: calibrate the current source using a comparator to compare a voltage reference signal with voltage level of the reference node; and configure the amplitude of the current based on a result of comparing the voltage reference signal with the voltage level of the reference node.

27. The apparatus as described in clause 26, wherein the current source comprises a current digital to analog converter (IDAC) responsive to a multibit digital value.

28. The apparatus as described in clause 27, wherein the means for configuring the amplitude of the current is further configured to: determine a process corner characterizing the replica transistor pair; and select maximum and minimum values for the multibit digital value based on the process corner.

29. The apparatus as described in any of clauses 26-28, wherein the means for calibrating the current source is further configured to: calibrate or configure the voltage reference signal.

30. The apparatus as described in any of clauses 22-29, wherein manufacturing process variations affect the replica transistor pair and the first transistor pair to the same extent.

31. The apparatus as described in any of clauses 22-30, wherein the replica transistor pair tracks a manufacturing process corner associated with the VCO by compensating for changes in performance or operation of the first transistor pair attributable to manufacturing process variances.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A clock generation circuit, comprising:
a voltage-controlled oscillator (VCO) comprising a first transistor pair coupled in series between a power rail and ground;
a replica transistor pair coupled in series between a reference node and ground and collocated on an integrated circuit with the first transistor pair, each transistor in the replica transistor pair being of a same type as a corresponding transistor in the first transistor pair;
a current source having an output coupled to the reference node;
a voltage regulator that has an input coupled to the reference node and that has an output coupled to the power rail, the voltage regulator being configured to maintain the power rail at a voltage level defined by the voltage level of the reference node;
a comparator having a first input coupled to a voltage reference signal and a second input coupled to the reference node; and
a calibration circuit having an input coupled to an output of the comparator and configured to control the current source.

2. The clock generation circuit of claim 1, wherein the VCO further comprises:
a second transistor pair coupled in series between the power rail and ground, wherein the first transistor pair is cross-coupled with the second transistor pair.

3. The clock generation circuit of claim 1, wherein the first transistor pair comprises:
an N-type metal-oxide-semiconductor (NMOS) transistor having a source that is coupled to ground, and a drain that is coupled to a first common node; and
a P-type metal-oxide-semiconductor (PMOS) transistor having a source that is coupled to the power rail, and a drain that is coupled to the first common node.

4. The clock generation circuit of claim 1, wherein the replica transistor pair comprises:
an NMOS transistor having a source that is coupled to ground, and a gate and a drain that are coupled at a second common node; and
a PMOS transistor having a source that is coupled to the reference node, and a gate and a drain that are coupled to the second common node.

5. The clock generation circuit of claim 1, wherein the current source comprises a current digital to analog converter (IDAC) and is coupled to a control signal that encodes a multibit digital value that determines an amplitude of current flowing through the replica transistor pair.

6. The clock generation circuit of claim 5, wherein the calibration circuit is configured to:
determine a process corner characterizing the replica transistor pair; and
select maximum and minimum values for the multibit digital value based on the process corner.

7. The clock generation circuit of claim 1, wherein the calibration circuit provides or configures the voltage reference signal.

8. The clock generation circuit of claim 1, wherein manufacturing process variations affect the replica transistor pair and the first transistor pair to the same extent.

9. The clock generation circuit of claim 1, wherein the replica transistor pair tracks a manufacturing process corner associated with the VCO by compensating for changes in performance or operation of the first transistor pair attributable to manufacturing process variances.

10. A method for generating clock signals, comprising:
configuring amplitude of a current provided by a current source to a replica transistor pair through a reference node; and
providing power to a power rail of a voltage-controlled oscillator (VCO) using a voltage regulator that has an input coupled to the reference node, the voltage regulator being configured to maintain the power rail at a voltage level defined by the voltage level of the reference node, wherein the VCO comprises a first transistor pair coupled in series between the power rail and ground, wherein the replica transistor pair is coupled in series between the reference node and ground and is collocated on an integrated circuit with the first transistor pair, wherein each transistor in the replica transistor pair is of a same type as a corresponding transistor in the first transistor pair;

comparing a voltage reference signal with voltage level of the reference node; and configuring the amplitude of the current provided by the current source using a result of comparing the voltage reference signal with the voltage level of the reference node.

11. The method of claim 10, wherein the VCO further comprises a second transistor pair coupled in series between the power rail and ground, and wherein the first transistor pair is cross coupled with the second transistor pair.

12. The method of claim 10, wherein the first transistor pair comprises:
an N-type metal-oxide-semiconductor (NMOS) transistor having a source that is coupled to ground, and a drain that is coupled to a first common node; and
a P-type metal-oxide-semiconductor (PMOS) transistor having a source that is coupled to the power rail, and a drain that is coupled to the first common node.

13. The method of claim 10, wherein the replica transistor pair comprises:
an NMOS transistor having a source that is coupled to ground, and a gate and a drain that are coupled at a second common node; and
a PMOS transistor having a source that is coupled to the reference node, and a gate and a drain that are coupled to the second common node.

14. The method of claim 10, further comprising:
comparing a voltage reference signal with voltage level of the reference node; and
calibrating the amplitude of the current provided by the current source using a result of comparing the voltage reference signal with the voltage level of the reference node.

15. The method of claim 14, wherein the current source comprises a current digital to analog converter (IDAC) responsive to a multibit digital code.

16. The method of claim 15, further comprising:
determining a process corner characterizing the replica transistor pair; and
selecting maximum and minimum values for the multibit digital code based on the process corner.

17. The method of claim 16, further comprising:
configuring the voltage reference signal based on the process corner.

18. The method of claim 10, wherein manufacturing process variations affect the replica transistor pair and the first transistor pair to the same extent.

19. An apparatus, comprising:
means for providing a current to a replica transistor pair, including a current source that is coupled to the replica transistor pair at a reference node;
means for configuring amplitude of the current provided to the replica transistor pair; and
means for providing power to a power rail of a voltage-controlled oscillator (VCO), including a voltage regulator that has an input coupled to the reference node, the voltage regulator being configured to maintain the power rail at a voltage level defined by the voltage level of the reference node, wherein the VCO comprises a first transistor pair coupled in series between the power rail and ground, wherein the replica transistor pair includes transistors coupled in series between the reference node and ground, wherein the replica transistor pair is collocated on an integrated circuit with the first transistor pair, wherein each transistor in the replica transistor pair is of a same type as a corresponding transistor in the first transistor pair, and wherein the means for configuring the amplitude of the current is configured to
calibrate the current source using a comparator to compare a voltage reference signal with voltage level of the reference node; and
configure the amplitude of the current based on a result of comparing the voltage reference signal with the voltage level of the reference node.

20. The apparatus of claim 19, wherein the VCO further comprises a second transistor pair coupled in series between the power rail and ground, and wherein the first transistor pair is cross coupled with the second transistor pair.

21. The apparatus of claim 19, wherein the first transistor pair comprises:
an N-type metal-oxide-semiconductor (NMOS) transistor having a source that is coupled to ground, and a drain that is coupled to a first common node; and
a P-type metal-oxide-semiconductor (PMOS) transistor having a source that is coupled to the power rail, and a drain that is coupled to the first common node.

22. The apparatus of claim 19, wherein the replica transistor pair comprises:
an NMOS transistor having a source that is coupled to ground, and a gate and a drain that are coupled at a second common node; and
a PMOS transistor having a source that is coupled to the reference node, and a gate and a drain that are coupled to the second common node.

23. The apparatus of claim 19, wherein the current source comprises a current digital to analog converter (IDAC) responsive to a multibit digital value.

24. The apparatus of claim 23, wherein the means for configuring the amplitude of the current is further configured to:
determine a process corner characterizing the replica transistor pair; and
select maximum and minimum values for the multibit digital value based on the process corner.

25. The apparatus of claim 19, wherein the means for configuring the amplitude of the current is further configured to calibrate or configure the voltage reference signal.

26. The apparatus of claim 19, wherein manufacturing process variations affect the replica transistor pair and the first transistor pair to the same extent.

27. The apparatus of claim 19, wherein the replica transistor pair tracks a manufacturing process corner associated with the VCO by compensating for changes in performance or operation of the first transistor pair attributable to manufacturing process variances.

* * * * *